United States Patent [19]
Ooki et al.

[11] Patent Number: 5,847,812
[45] Date of Patent: Dec. 8, 1998

[54] PROJECTION EXPOSURE SYSTEM AND METHOD

[75] Inventors: Hiroshi Ooki, Yokohama; Masato Shibuya, Ohmiya; Kazuya Okamoto, Yokohama; Soichi Owa, Tokyo, all of Japan

[73] Assignee: Nikon Corporation, Tokyo, Japan

[21] Appl. No.: 874,687

[22] Filed: Jun. 13, 1997

[30] Foreign Application Priority Data

Jun. 14, 1996 [JP] Japan .................................... 8-175921
Jun. 14, 1996 [JP] Japan .................................... 8-175924

[51] Int. Cl.$^6$ ............................. G03B 27/42; G03B 27/72
[52] U.S. Cl. ............................................... 355/67; 355/53
[58] Field of Search ............................ 355/67, 69, 53, 355/77

[56] References Cited

U.S. PATENT DOCUMENTS 5,473,408  12/1995  Hoffman et al. ........................... 355/53
5,739,898  4/1998  Ozawa et al. .............................. 355/53

FOREIGN PATENT DOCUMENTS

07326561 A  12/1995  Japan .

Primary Examiner—A. A. Mathews
Attorney, Agent, or Firm—Klarquist Sparkman Campbell Leigh & Whinston, LLP

[57] ABSTRACT

Projection exposure systems and methods are disclosed that achieve higher light intensities and reduce the time required for each exposure in multiple exposures of non-linear resists such as a two-photon-absorption resist. Using spatial redistribution of laser light, an illumination optical system forms an illumination region that illuminates only a portion of the pattern on a mask with spatially coherent light from a light source. The system forms the entire mask pattern on a substrate by repeating a non-linear exposure while moving the illumination region and the mask pattern relative to one another. To exploit temporal redistribution of laser light, an illumination optical system employs a pulsed-oscillation-type laser light source to form a mask pattern while varying the light intensity profile on a mask.

29 Claims, 4 Drawing Sheets

PROJECTION EXPOSURE SYSTEM AND METHOD

FIELD OF THE INVENTION

The invention relates to a projection exposure system and method, and in particular, relates to a projection system that can be used in the manufacture of semiconductor elements, liquid-crystal display elements, or the like.

BACKGROUND OF THE INVENTION

Art related to a multiple nonlinear exposure method has, for example, been disclosed by the inventors of the present application in Japanese laid-open patent application 6-291009 [1994] and in *Japanese Journal of Applied Physics*, Vol. 33 (1994), Letter 177. A "multiple nonlinear exposure" method typically employs a resist having photosensitive characteristics that cause an exposure to proceed in a nonlinear fashion with respect to the intensity of incident light. Multiple exposures are carried out while varying the light intensity profile at a wafer coated with the resist.

At the time of exposure, a latent image reaction density x is produced at the resist as indicated by Equation (1), below.

$$x = n \exp(-C \cdot I^m \cdot T) \tag{1}$$

where I is the intensity of incident light, T is the exposure time, and C is a constant. In Equation (1) the exponent m is a measure of the linearity of the resist. For resists possessing photosensitive characteristics such that m=1, such as is the case with positive resists currently in general use, exposure proceeds in a linear fashion with respect to the intensity of incident light. On the other hand, for resists possessing photosensitive characteristics such that m≠1, exposure proceeds in a nonlinear fashion with respect to the intensity of incident light.

To produce a "multiple" nonlinear exposure, the non-linear exposure is repeated after changing the light intensity profile at the wafer by, for example, changing the position of the mask pattern with respect to the projection optical system, or by changing the mask pattern itself, or the like. The multiple nonlinear exposure technique permits a fine pattern with a resolution exceeding that of the diffraction limit to be formed on the wafer.

One drawback of the nonlinear exposure technique is that it generally requires higher light intensities and longer exposure times than are normally employed for conventional exposures. As an example of a resist having non-linear exposures with respect to the light intensity, consider a two-photon-absorption resist possessing photosensitive characteristics where m=2. According to a paper presented by En. S. Wu et al. and published in *Proceedings of SPIE*, Vol. 1674 (1992), pp. 776–778, the two-photon absorption efficiency W (units=photon/sec) is given by $W = dI^2$.

In addition, the two-photon absorption quantity V is given by $V = WT = dI^2 T$. Here, the constant d is approximately $10^{-58}$ $m^4$ sec/photon.

Given such a value for the constant d, it will be difficult to achieve exposure when employing a two-photon-absorption resist unless $I^2 T$ is made extremely large. This means that multiple nonlinear exposure techniques employing, for example, two-photon-absorption resists will require much higher light intensities and much longer exposure times than are normally employed for a conventional exposure.

SUMMARY OF THE INVENTION

In light of the foregoing problems, one objective of the invention is to provide a projection exposure system and method that achieve the required light intensities for non-linear exposures. Another objective is to reduce the time required for each exposure in a multiple exposure method for a non-linear resist, such as a two-photon-absorption resist.

One aspect of the invention is a projection exposure system that performs multiple non-linear exposures by illuminating a portion of a mask with spatially coherent light and generates the entire image of the mask by moving the mask and illumination region on the substrate synchronously relative to each other. The projection exposure system includes an illumination optical system and a projection optical system. The illumination optical system condenses light from a light source and illuminates a mask defining a pattern. The projection optical system forms an image of the pattern of the mask on a photosensitive substrate. The substrate is coated with a resist having photosensitive characteristics such that exposure proceeds in a nonlinear fashion with respect to the intensity of incident light.

The projection exposure system performs multiple exposures while varying the light intensity profile on the substrate. Specifically, in one embodiment, the illumination optical system forms an illumination region illuminating only a portion of the patterned region of the mask with spatially coherent light from the light source. The projection exposure system progressively forms the entire image of the mask pattern on the substrate by moving the illumination region and the mask pattern relative to one another during exposure.

In a preferred mode of the projection exposure system, the latent image reaction density of the resist is a function of the incident light intensity to the mth power (where m>1).

There are a number of alternative ways to implement the projection exposure system such that the mask and illumination region can be moved relative to each other. One embodiment of the projection exposure system comprises a drive system for moving the illumination optical system relative to the mask, the projection optical system, and the substrate. An alternative embodiment has a drive means for moving the mask and substrate relative to the illumination optical system and the projection optical system.

As noted above, the invention also provides an exposure method for performing non-linear exposures. One embodiment of the exposure method forms an illumination region that illuminates only a portion of the patterned region of the mask with spatially coherent light from the light source. The entire image of the mask pattern is progressively formed on the substrate by moving the illumination region and the mask pattern relative to one another.

In a preferred mode of the exposure method of the invention, the latent image reaction density of the resist is formed in the mth power (where m>1) of the incident light intensity.

The exposure method can be implemented such that the entire image is formed on the substrate by moving the illumination optical system relative to the mask, the projection optical system, and the substrate. Alternatively, the method can be implemented such that the entire image is formed by moving the mask and substrate relative to the illumination optical system and the projection optical system. In both of these implementations, the entire mask pattern can be formed on the substrate by progressively scanning portions of the mask pattern across the substrate.

Another aspect of the invention is a projection exposure system having an illumination optical system that condenses a laser beam from a pulsed-oscillation-type laser light source. The illumination optical system illuminates a mask defining a pattern. A projection optical system receives light that passes through the mask and forms an image of the mask pattern on a photosensitive substrate. The substrate is coated with a resist possessing photosensitive characteristics such that exposure proceeds in nonlinear fashion with respect to the intensity of light incident. Using the pulsed oscillation light source, the projection exposure system performs multiple exposures while varying the light intensity profile at the substrate.

The invention also provides a method for performing multiple non-linear exposures using a pulsed-laser oscillation type light source. This method condenses a laser beam from a pulsed-oscillation-type laser light source, and illuminates a mask defining a desired pattern. The method forms an image of the pattern of the mask on a photosensitive substrate. The substrate is coated with a resist possessing photosensitive characteristics such that exposure proceeds in nonlinear fashion with respect to the intensity of light incident thereon. The method performs multiple nonlinear exposures while varying the light intensity profile at the substrate.

DETAILED DESCRIPTION

Figure 1A:
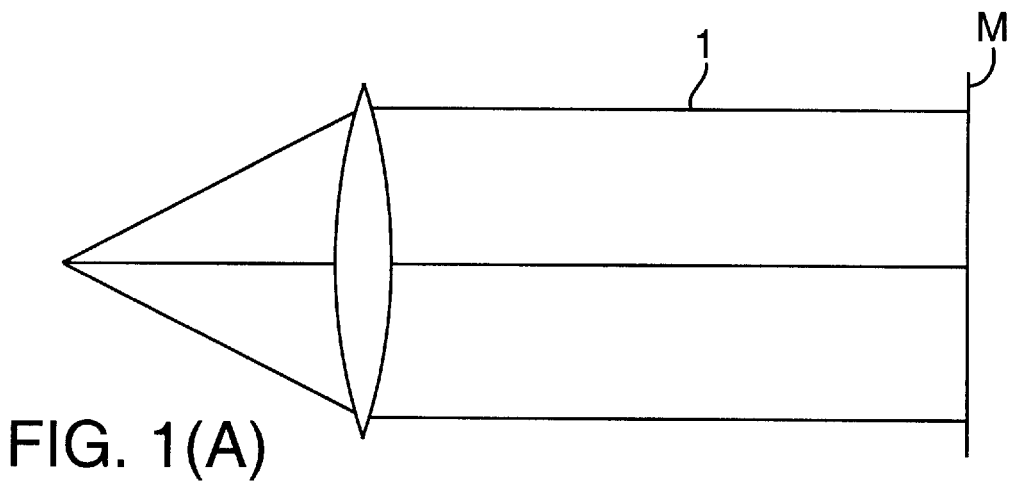
FIGS. 1(A)–1(B) are diagrams showing how, when a light source supplying spatially coherent light is used, the numerical aperture NA of the illuminant light does not change despite a change in the area of the illumination region.
Figure 1B:
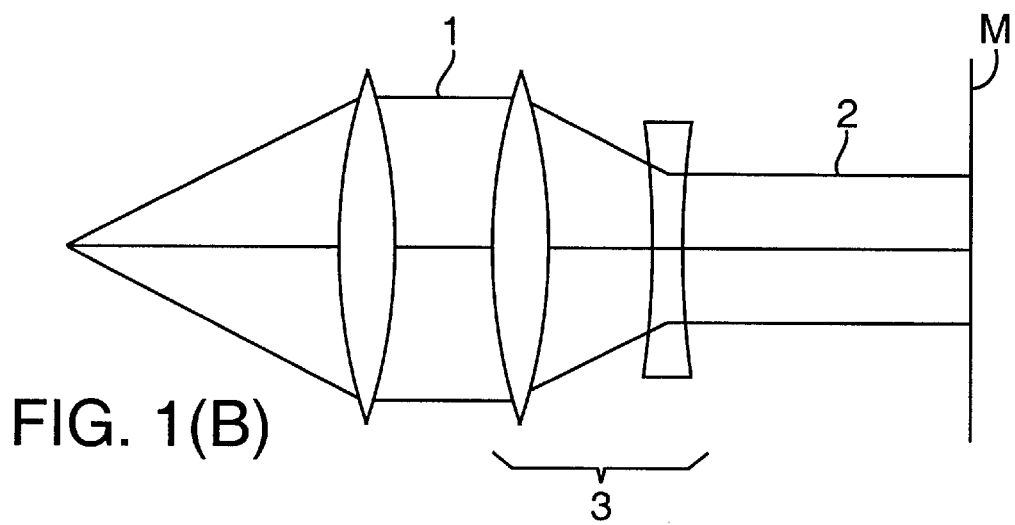

In FIG. 1(A), the entire pattern on a mask M is irradiated by a laser beam 1, producing an image of the entire mask pattern on the substrate (not shown but located downstream of the mask M). In FIG. 1(B), the laser beam 1 is constricted by an afocal optical system 3 to increase the intensity profile of the laser light impinging on the mask M. The constricted laser beam 2, which is narrower and thus more intense per unit area than the laser beam 1, irradiates a region of the pattern defined by the mask M. In FIG. 1(B), an image of the illuminated region of the mask pattern is produced on the substrate. Further with respect to FIG. 1(B), if the same projection optical system (not shown, but located between the mask M and the substrate) is used as in FIG. 1(A), the mask-pattern image formed on the substrate is brighter than the mask-pattern image formed using the configuration of FIG. 1(A).

Thus, when a laser light source is used to provide the illumination light flux, the numerical aperture NA of the illumination light does not change despite a reduction in the size of the illuminated region on the mask. However, if a light source other than a laser light source is used, a reduction in the size of the illuminated region will result in an increase in the numerical aperture NA of the illumination light. Consequently, in order to obtain a brighter image, the numerical aperture NA of the projection optical system must be increased. This follows as a natural consequence of the fact that luminance is conserved. Accordingly, using a laser light source provides a light intensity I of the image that can be increased by decreasing the size of the illuminated region of the mask without at the same time producing other unwanted effects.

In the discussion below, it is assumed that the light intensity I of the illumination light during static exposure of the entire mask pattern is 1. It is also assumed that the required exposure time T when a two-photon-absorption resist is employed is 1. The two-photon absorption quantity V is proportional to $I^2T$, and since the above assumptions imply that $I^2T=1$, the value of $I^2T$ must be 1 to complete exposure.

Next, the beam of illumination light is shaped so as to give it a slit-shaped transverse section such that the width of the laser beam illuminating the mask is 1/10th of the overall width of the mask pattern. In order to avoid light loss, beam shaping should be carried out by way of, for example, an afocal optical system or the like.

The light intensity I at this time will be 10 times the light intensity during static exposure of the entire mask pattern; i.e., the light intensity will be 10. Accordingly, $I^2$ will be equal to 100. From the relationship $I^2T=1$, exposure will require an exposure time T which is only 1/100th of that required during static exposure of the entire mask pattern. However, because the shaping of the beam reduces the size of the illumination region to 1/10th of its former size, the exposure time required for exposure of the entire mask pattern is increased by a factor of 10. Consequently, as a result of these two effects, reducing the size of the illumination region to 1/10th of its former size permits exposure to be completed in only 1/10th of the former exposure time.

In general, in the case of an exposure using a two-photon-absorption resist, reducing the size of the illumination region to 1/nth of its former size will permit exposure to be completed in 1/nth of the former exposure time. For example, an afocal optical system can be used to create slit-shaped illuminant light that increases the light intensity I and significantly reduces the exposure time T. The slit-shaped illuminant light can be scanned across the mask to create the entire image in less time than using the same light source to illuminate the entire mask and form the same image with one exposure. If there is no need to reduce exposure time T, one may employ a laser light source of lower power.

Although, in the above descriptions, increased intensity of illumination light was achieved through a spatial redistribution of laser light, it is also possible to increase light intensity through a temporal redistribution of laser light.

Light intensity can be increased through temporal redistribution of laser light. That is, assuming the same average power, pulsed-oscillation laser light sources, with their high peak power, are more advantageously used for exposure than continuous-oscillation laser light sources when two-photon-absorption resists are employed. As described above, the two-photon absorption quantity V is proportional to $I^2T$. If a continuous-oscillation laser is used, taking the average power of the laser to be $I_{av}$, the two-photon absorption quantity V will be proportional to $I_{av}^2T$. On the other hand, if a pulsed-oscillation laser is used, taking the peak power to be $I_{pe}$ and taking the ratio between the oscillation time and the oscillation period to be R (where R<1), the two-photon absorption quantity V will be proportional to $I_{pe}^2RT=I_{pe}I_{av}T=I_{av}^2T/R$.

Thus, for identical exposure times, a pulsed-oscillation laser will produce a two-photon absorption quantity V which is 1/Rth of that of a continuous-oscillation laser possessing the same average power. In other words, exposure time with a pulsed-oscillation laser is R times that of a continuous-oscillation laser possessing the same average power. But, since R<1, this means that use of a pulsed-oscillation laser permits a reduction in exposure time. That is, if one prefers to keep exposure time the same, a pulsed-oscillation laser of lower power can be employed. This is equivalent to saying that temporal redistribution of an amount of light corresponding to the factor R causes exposure time to be changed by the factor R. That is, just as was the case with spatial redistribution, by temporally redistributing the laser light, it is possible to increase the intensity of that light.

As described above, during exposure when two-photon-absorption resists are employed, it is possible to achieve dramatic reductions in exposure times as a result of spatial redistribution—and where necessary, as a result of temporal redistribution as well—of illuminant light. Alternatively, it is possible to achieve dramatic reductions in laser power as a result of spatial redistribution—and where necessary, as a result of temporal redistribution as well—of illuminant light. This is generally true for resists possessing nonlinear photosensitive characteristics where m>1 in Equation (1), above.

It will be appreciated from the foregoing that spatial redistribution and/or temporal redistribution will likely also be advantageous for other resists for which exposure proceeds according to $I^m T$, where m>1. In general, even for resists possessing nonlinear photosensitive characteristics that cannot be described in terms of the light intensity raised to a certain power, it is evident that spatial redistribution and/or temporal redistribution can be advantageous.

Figure 2:
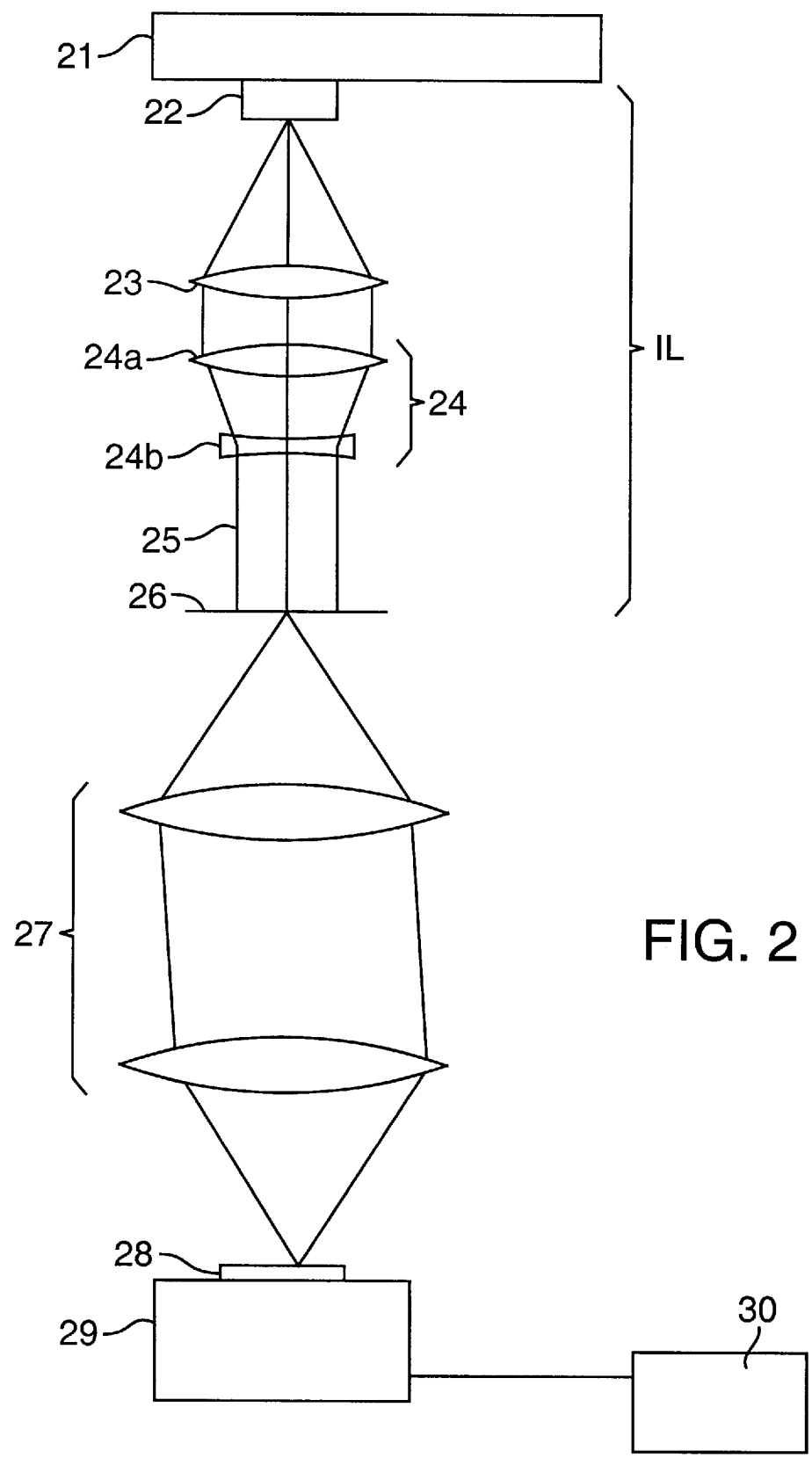
FIG. 2 is a schematic drawing showing Embodiment 1 of a projection exposure system.

We will now describe embodiments of the invention based on the attached drawings. FIG. 2 is a schematic drawing showing Embodiment 1 of a projection exposure system.

The projection exposure system of FIG. 2 has a pulsed-oscillation-type laser light source 22. The peak power $I_{pe}$ of the laser light source 22 is 100 times its average power $I_{av}$. Light emitted from the laser light source 22, after being transformed into a more or less collimated light beam by a collimating lens 23, is incident upon an afocal optical system 24. The afocal optical system 24 comprises a pair of cylindrical lenses 24a and 24b. The cylindrical lens 24a possesses positive refractive power within the plane of the page of FIG. 2, and no refractive power within planes perpendicular to the plane of the page. The cylindrical lens 24b possesses negative refractive power within the plane of the page, and no refractive power within planes perpendicular to the plane of the page.

The illumination light flux passing through the afocal optical system 24, after being shaped into a light beam 25, has a width within the plane of the page that is narrower than the width of the light beam in the direction perpendicular to the plane of the page. The light then illuminates a mask 26 that defines an image to be projected. The laser light source 22, collimating lens 23, and afocal optical system 24 thus comprise an illumination optical system IL for the purpose of illuminating the mask 26. The construction of the projection exposure system of FIG. 2 is such that the entire illumination optical system IL can be driven in the horizontal direction within the plane of the page of FIG. 2 by an appropriate drive system 21.

Light diffracted by the pattern of the mask 26 is refracted by a projection optical system 27 to form an image of the mask pattern at the surface of a wafer 28 (as an example of a photosensitive substrate). The surface of the wafer 28 is coated with a two-photon-absorption-type resist. The wafer 28 is secured to a wafer stage 29. The wafer stage 29 is constructed so that it can be driven two-dimensionally within a plane perpendicular to the optical axis of the projection optical system 27 by an appropriate drive system 30.

The size of the image plane (the region within the field of view) of the projection optical system 27 is sufficient to include the entire pattern on the mask 26. However, as a result of the action of afocal optical system 24, the width in the plane of the page of the laser beam 25 that irradiates the mask 26 is set so as to be approximately 1/100th of the size of the image plane of the projection optical system 27. In other words, the laser beam 25 is set so as to illuminate approximately 1/100th of the entire pattern on the mask 26.

Thus, during a single exposure operation, the illumination optical system IL is driven in the horizontal direction within the plane of the page by the drive system 21. As a result, the illumination light beam 25 is scanned, in the horizontal direction within the plane of the page, across the pattern defined by the mask 26. Such scanning exposure achieves formation of the entire image of the mask pattern on the wafer 28.

In multiple nonlinear exposure, after the first exposure, the relative position of the mask 26 with respect to the projection optical system 27 is changed, the mask pattern is changed by replacing the mask 26 with another mask, or the relative position of the wafer 28 with respect to the projection optical system 27 is changed. The projection exposure system performs multiple non-linear exposures by repeating an exposure after changing the light intensity profile at the wafer 28. Such multiple nonlinear exposures permit a fine pattern having a resolution exceeding that of the diffraction limit to be formed on the wafer 28.

In Embodiment 1, the projection exposure system uses a slit-shaped light beam that irradiates, for example, 1/100th of the mask pattern to perform each exposure as the mask pattern is scanned. As described above, this implementation permits exposure time to be reduced to 1/100th of that required during static exposure of the entire mask pattern. Furthermore, because the peak power of the pulsed-oscillation laser 22 is 100 times its average power, exposure time can be further reduced to 1/100th of that of a continuous-oscillation laser possessing the same average power.

Figure 3:
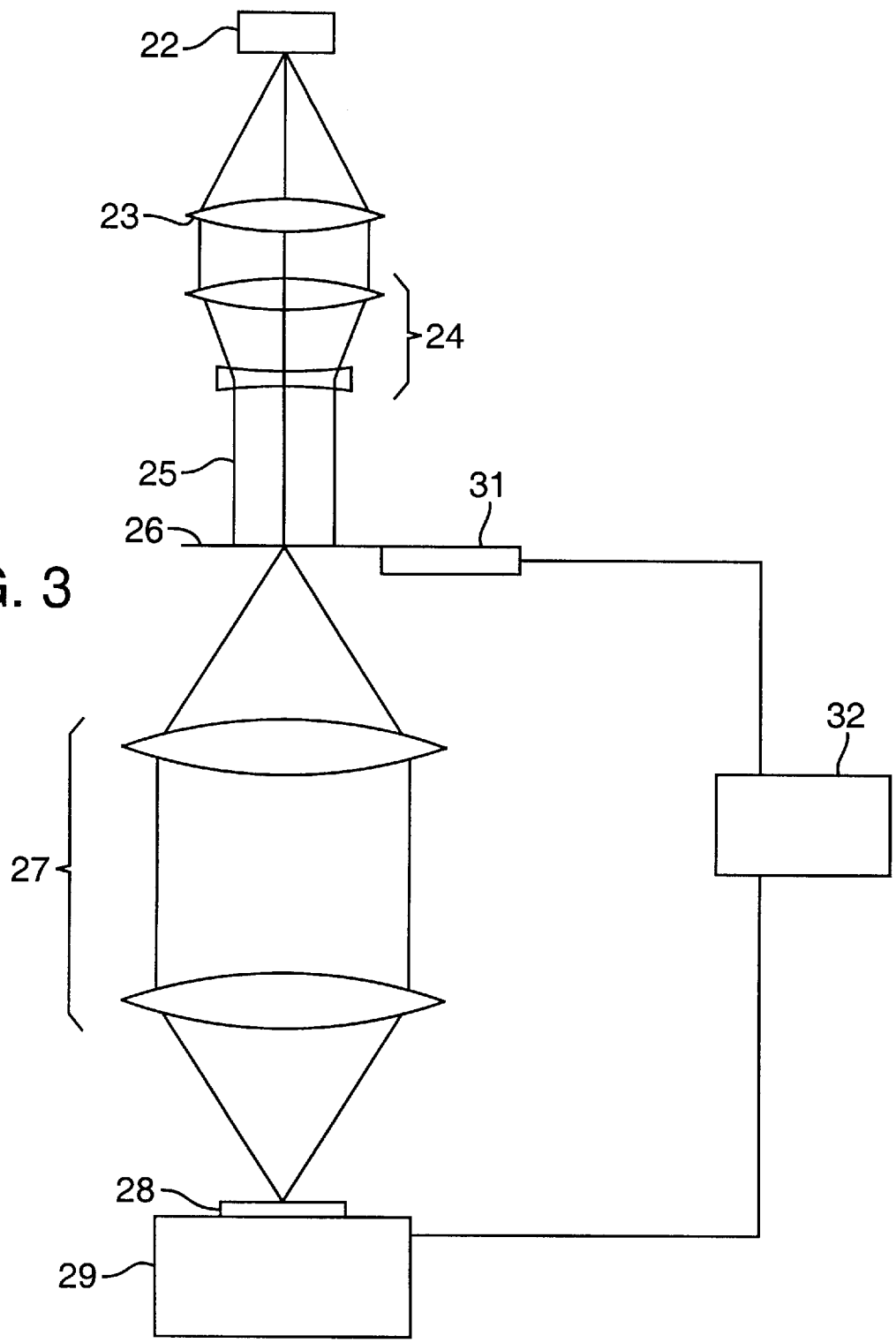
FIG. 3 is a schematic drawing showing Embodiment 2 of a projection exposure system.

FIG. 3 is a schematic drawing showing Embodiment 2 of a projection exposure system. Embodiment 2 is similar to Embodiment 1 except that, during exposure using Embodiment 2, the illumination optical system is not moved, but instead the mask and the wafer are synchronously moved. In FIG. 3, components possessing the same functions as corresponding components in Embodiment 1 have the same reference designators. Below, Embodiment 2 is described principally in terms of components that are different from Embodiment 1.

In Embodiment 2, a mask 26 is secured to a mask stage 31. The mask stage 31 is can be driven in the horizontal direction within the plane of the page of FIG. 3 by a motor 32 or analogous drive means. The motor 32 also drives a wafer stage 29 in a direction horizontal within the plane of the page and opposite to that of the mask stage 31, in ganged fashion with respect to the movement of mask stage 31.

Just as was the case in Embodiment 1, Embodiment 2 performs multiple nonlinear exposures by illuminating a portion of the mask pattern and performing multiple exposures by scanning the mask pattern. However, to form each exposure in Embodiment 2, the mask 26 and the wafer 28 are moved in mutually opposite directions along a horizontal direction within the plane of the page. The illuminant light beam 25 is also scanned, in the horizontal direction within the plane of the page, across the pattern formed on the mask 26, and the wafer 28 moves so as to follow the movement of the mask pattern image. Here, the size of the image plane (the region within the field of view) of the projection optical system 27 need not be large enough to include the entire patterned region of the mask 26.

Thus, Embodiment 2 performs each exposure by scanning across the mask a slit-shaped light beam that irradiates 1/100th of the mask pattern. This approach permits exposure time to be reduced to 1/100th of that required during static exposure of the entire mask pattern. Furthermore, because the peak power of the pulsed-oscillation laser 22 is 100 times its average power, exposure time can be further reduced to 1/100th of that of a continuous-oscillation laser possessing the same average power.

As described above, when two-photon-absorption resists are employed, it is possible to achieve dramatic reductions in exposure times as a result of temporal redistribution of illuminant light. Alternatively, it is possible to achieve dramatic reductions in laser power as a result of temporal redistribution of illuminant light. This is in general true for resists having nonlinear photosensitive characteristics where m>1 in Equation (1), above. That is, temporal redistribution will also be advantageous for other resists for which exposure proceeds in correspondence to $I^m T$ (where m>1). Moreover, in general, even for resists possessing nonlinear photosensitive characteristics that cannot be described in terms of the light intensity raised to a certain power, it is evident that there will be instances in which temporal redistribution will be advantageous.

Figure 4:
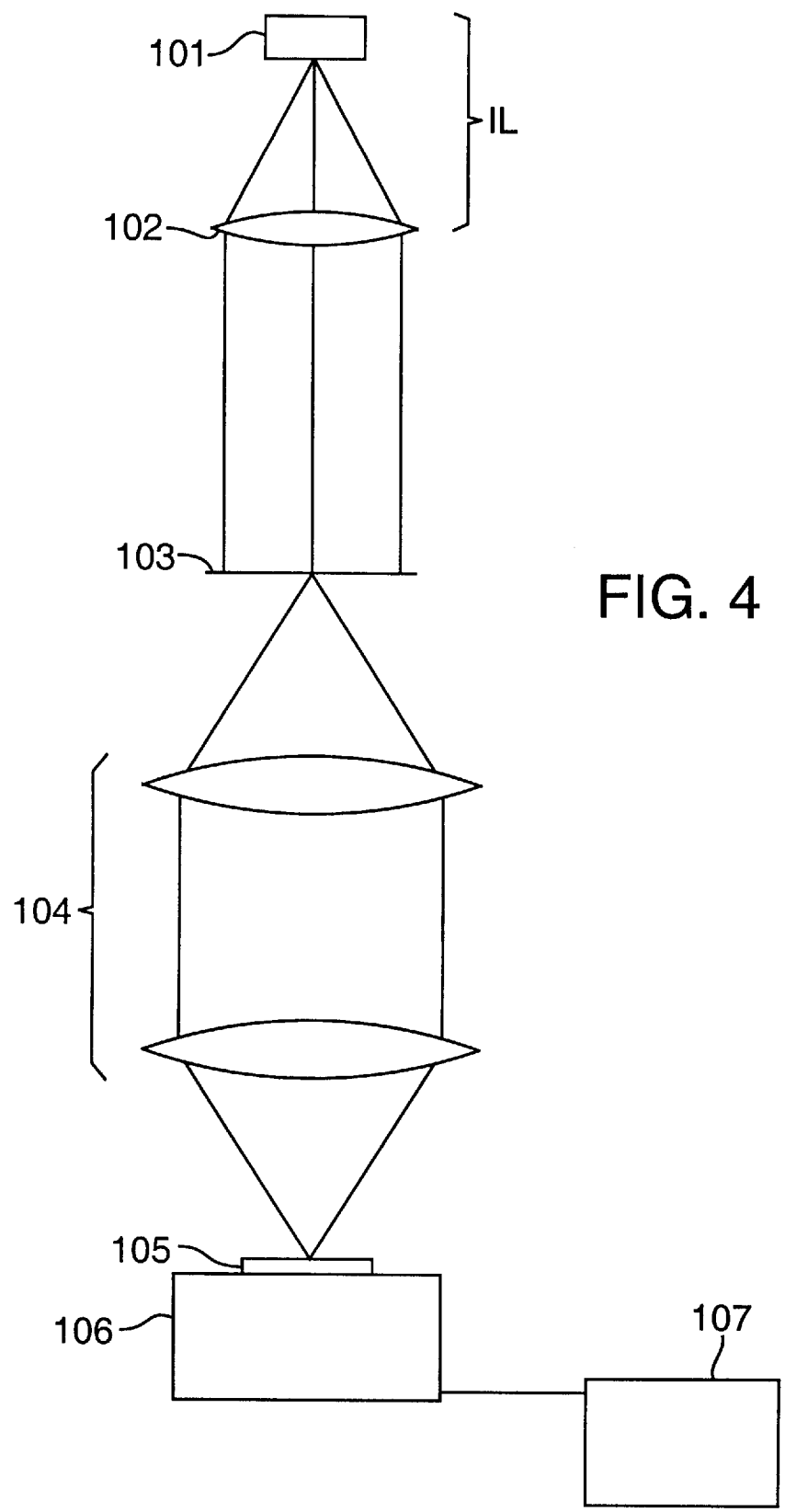
FIG. 4 is a schematic drawing showing Embodiment 3 of a projection exposure system.

FIG. 4 is a schematic drawing showing Embodiment 3 of a projection exposure system. The projection exposure system of FIG. 4 comprises a pulsed-oscillation-type laser light source 101. The peak power $I_{pe}$ of the laser light source 101 is, e.g., 100 times its average power $I_{av}$. Light emitted from the laser light source 101, after being transformed into a substantially collimated light beam by a collimating lens 102, illuminates a mask 103 defining the pattern to be projected. The laser light source 101 and collimating lens 102 thus constitute an illumination optical system IL for the purpose of illuminating the mask 103.

Light diffracted by the pattern of the mask 103 passes through a projection optical system 104 which forms an image of the mask pattern at the surface of a wafer 105 serving as a photosensitive substrate. The size of the image plane (the region within the field of view) of the projection optical system 104 is sufficient to include the entire pattern on the mask 103. Furthermore, the surface of the wafer 105 is coated with a two-photon-absorption-type resist. The wafer 105 is secured to a wafer stage 106, and the wafer stage 106 is constituted such that it can be driven two-dimensionally within a plane perpendicular to the optical axis of the projection optical system 104 by an appropriate drive system 107.

Thus, the entire image of the mask pattern is formed on the wafer 105 during a single exposure. To perform multiple nonlinear exposures, the projection exposure system shown in FIG. 4 can change the light intensity profile after completing each exposure. The light intensity profile can be changed, for example, by changing the relative position of the mask 103 with respect to the projection optical system 104, changing the mask pattern by replacing the mask 103 with another mask, or changing the relative position of the wafer 105 with respect to the projection optical system 104. By repeating exposure after changing the light intensity profile at the wafer 105, the projection exposure system in FIG. 4 can perform multiple nonlinear exposures. Such multiple nonlinear exposure permits a fine pattern possessing a resolution exceeding that of the diffraction limit to be formed on the wafer 105.

In Embodiment 3 described above, the peak power of the pulsed-oscillation-type laser light source 101 is 100 times its average power. As a result, as described above, exposure time can be reduced to 1/100th of that of a continuous-oscillation laser possessing the same average power.

The above embodiments are described using the example of a two-photon-absorption resist. However, as mentioned above, other resists can be used for which exposure proceeds in a nonlinear fashion in correspondence to $I^m T$ (where m>1). Moreover, this invention is applicable to resists possessing nonlinear photosensitive characteristics that cannot be described in terms of the light intensity raised to a certain power.

As described above, the projection exposure system and exposure method of the invention achieve the required light intensities to perform non-linear exposures and permit dramatic reductions in the time required for each exposure in a series of multiple non-linear exposures employing, for example, two-photon-absorption resists.

Whereas the invention has been described in connection with preferred embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A projection-exposure system, comprising:
   (a) light source means for producing a spatially coherent illumination light flux having a first level of light intensity per unit area;
   (b) illumination-optical means for directing the illumination light flux to impinge on a mask defining a pattern to be transferred by the illumination light flux to a photosensitive substrate;
   (c) light-intensity-increasing means for increasing, with respect to the illumination light flux produced by the light source means, the level of light intensity per unit area to a second level higher than the first level;
   (d) mask-holding means for holding the mask such that a region of the mask pattern is illuminated by the illumination light flux at the second level of light intensity; and
   (e) projection-optical means for directing the light passing through the illuminated region of the mask pattern onto the photosensitive substrate such that an image of the illuminated region of the mask pattern is formed on the photosensitive substrate.

2. The system of claim 1, wherein said light-intensity-increasing means comprises means for spatially redistributing the illumination light flux to increase the intensity of the illumination light flux to the second level.

3. The system of claim 2, wherein said means for spatially redistributing the illumination light flux comprises an afocal optical system.

4. The system of claim 3, wherein the afocal optical system constricts the illumination light flux before the illumination light flux impinges on the mask pattern.

5. The system of claim 4, wherein the afocal optical system forms the constricted illumination light flux to have a slit-shaped transverse profile.

6. The system of claim 5, further comprising a substrate-holding means for holding the substrate, and a drive means operably connected to the mask-holding means and the substrate-holding means to move the mask-holding means and the substrate-holding means in a coordinated manner relative to the projection-optical means during exposure of the mask by the illumination light flux so as to transfer the entire mask pattern to the substrate during the exposure.

7. The system of claim 5, further comprising a substrate-holding means for holding the substrate and a first drive means for moving the substrate-holding means relative to the projection-optical means during exposure, the illumination-optical means further comprising a second drive means for moving the illumination-optical means relative to the mask and in coordination with movement of the substrate-holding means so as to transfer the entire mask pattern to the substrate during exposure of the substrate.

8. The system of claim 1, further comprising drive means for causing the illumination-optical means to move relative to the mask, the projection-optical means, and the substrate during exposure of the substrate.

9. The system of claim 1, further comprising drive means for causing the mask and substrate to move relative to the illumination-optical means and the projection-optical means during exposure of the substrate.

10. The system of claim 3, wherein the afocal optical system comprises first and second cylindrical lenses.

11. The system of claim 1, wherein said light-intensity-increasing means comprises means for temporally redistributing the illumination-light flux.

12. The system of claim 11, wherein said means for temporally redistributing the illumination light flux comprises laser-pulsing means for producing pulses of the illumination-light flux, each pulse having an intensity at the second level.

13. The system of claim 11, wherein said light-intensity-increasing means further comprises means for spatially redistributing the illumination light flux to increase the intensity of the illumination light flux to a level greater than the first level.

14. In a projection-exposure method in which light from a light source is condensed by an illumination optical system for illuminating a pattern defined by a mask, and a projection optical system is used to form an image of the pattern on a photosensitive substrate coated with a resist possessing photosensitive characteristics such that exposure proceeds in a nonlinear manner with respect to the intensity of light incident on the resist, an improvement comprising:

(a) forming a spatially coherent illumination light flux having a first intensity level;

(b) redistributing the intensity profile of the illumination light flux either temporally or spatially, or both, so as to increase the intensity of the illumination light flux per unit area to a second intensity level higher than the first intensity level;

(c) illuminating a region of the pattern defined by the mask with the illumination light flux having a redistributed intensity profile and the second intensity level so as to expose a corresponding region of the substrate; and (d) forming an image of the pattern on the substrate by repeating the exposure as the illumination region and the mask are moved relative to one another.

15. The exposure method of claim 14, wherein a latent image reaction density of the resist is formed on the substrate as function of the incident light intensity to the mth power, where m>1.

16. The exposure method of claim 14 further comprising moving the illumination optical system relative to the mask, the projection optical system, and the substrate.

17. The exposure method of claim 15, further comprising moving the illumination optical system relative to the mask, the projection optical system, and the substrate.

18. The exposure method of claim 14, further comprising moving the mask and the substrate relative to the illumination optical system and the projection optical system.

19. The exposure method of claim 15, further comprising moving the mask and the substrate relative to the illumination optical system and the projection optical system.

20. The exposure method of claim 14, wherein, in step (a) the illumination light flux is formed using a laser.

21. The exposure method of claim 20, wherein the laser is a pulsed laser.

22. A method for exposing a photosensitive substrate with a pattern defined by a mask, the method comprising:

(a) forming a flux of spatially coherent illumination light having a first level of light intensity per unit area;

(b) directing the illumination light flux toward the mask;

(c) before the illumination light flux impinges on the mask, increasing the level of light intensity of the illumination light flux per unit area to a second level higher than the first level;

(d) causing the illumination light flux at the second intensity level to impinge on at least a portion of the pattern defined by the mask;

(e) after the illumination light flux has passed through the mask, projecting the illumination light flux onto a corresponding region of the substrate to form an image of the illuminated region of the mask on the corresponding region of the substrate.

23. The method of claim 22, wherein step (c) comprises spatially redistributing the illumination light flux to increase the intensity of the illumination light flux to the second level.

24. The method of claim 23, wherein the step of spatially redistributing the illumination light flux comprises passing the illumination light flux at the first level through an afocal optical system serving to constrict the illumination light flux.

25. The method of claim 24, wherein step (e) comprises simultaneously exposing the entire pattern on the mask.

26. The method of claim 22, wherein step (c) comprises temporally redistributing the illumination-light flux to increase the intensity of the illumination light flux to the second level.

27. The method of claim 26, wherein the step of temporally redistributing the illumination light flux comprises pulsing the illumination light flux in a manner whereby each pulse has an intensity at the second level.

28. The method of claim 27, wherein step (e) comprises performing a plurality of exposures of the pattern on the mask with the pulsed illumination light flux while varying a light intensity profile of the light on the substrate.

29. The method of claim 28, wherein a latent image reaction density of the resist is formed on the substrate as a function of the incident light intensity to the mth power, where m>1.

* * * * *